United States Patent
Hsu et al.

(10) Patent No.: US 6,399,437 B1
(45) Date of Patent: Jun. 4, 2002

(54) ENHANCED SIDE-WALL STACKED CAPACITOR

(75) Inventors: Yung-Yi Hsu; Yi-Tsai Yi; Chia-Shun Hsiao; Ming-Huan Tsai, all of Hsinchu (TW)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 09/099,258

(22) Filed: Jun. 18, 1998

Related U.S. Application Data

(63) Continuation of application No. 08/677,601, filed on Jul. 8, 1996, now abandoned.

(51) Int. Cl.$^7$ .......................................... H01L 21/8242
(52) U.S. Cl. ...................................... 438/253; 438/255
(58) Field of Search ................................ 438/253–256, 438/396–399

(56) References Cited

U.S. PATENT DOCUMENTS 5,447,878 A * 9/1995 Park et al.

* cited by examiner

Primary Examiner—Jey Tsai
(74) Attorney, Agent, or Firm—Tung & Associates

(57) ABSTRACT

A method of forming a stacked capacitor having improved capacitance in a dynamic random access memory device is provided wherein and additional pad polysilicon layer is deposited prior to the forming of the capacitor cell contact area such that the side-wall of the capacitor cell can be increased. The increased side-wall thickness of the capacitor cell leads to an improved capacitance value for the cell. The present invention also provides a stacked capacitor formed in a semiconductor device that contains an additional pad polysilicon layer for increasing the thickness of the capacitor side-wall and subsequently its capacitance.

14 Claims, 2 Drawing Sheets

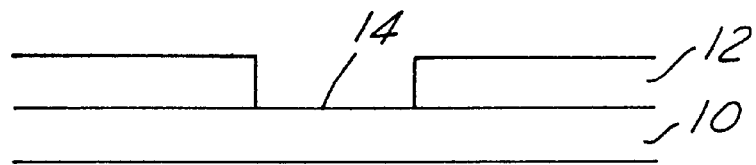
(PRIOR ART) FIG. 1
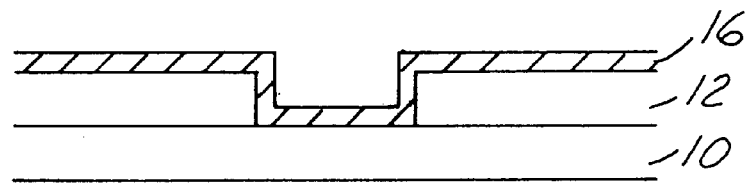
(PRIOR ART) FIG. 2
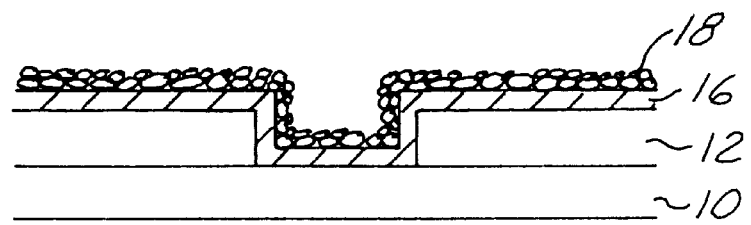
(PRIOR ART) FIG. 3
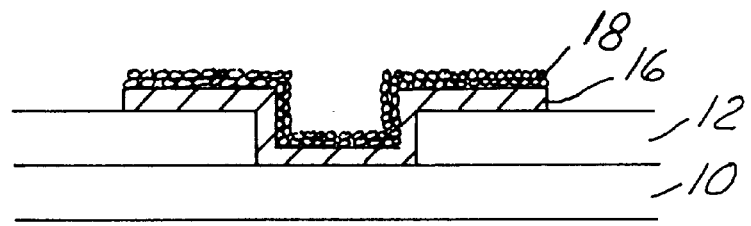
(PRIOR ART) FIG. 4
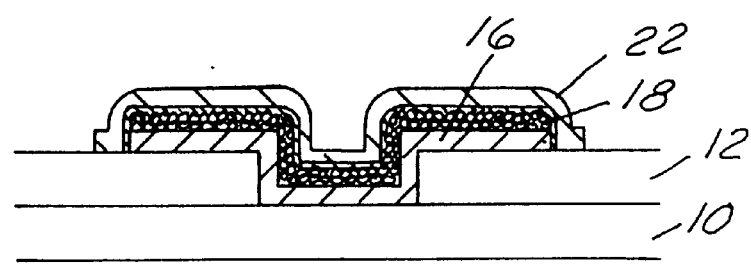
(PRIOR ART) FIG. 5

ENHANCED SIDE-WALL STACKED CAPACITOR

This application is a continuation of Ser. No. 08/677,601 filed Jul. 8, 1996, now abandoned.

FIELD OF THE INVENTION

The present invention generally relates to a stacked capacitor for a semiconductor device and a method of making such capacitor and more particularly, relates to a stacked capacitor for a dynamic random access memory (DRAM) device that has enhanced side-wall for improved capacitance and a method of fabricating the capacitor.

BACKGROUND OF THE INVENTION

In the technology of fabricating DRAM devices for integrated circuits, it is important for a storage node capacitor cell that is built into the device to have a large capacitance in order to retain adequate voltages. In modern semiconductor devices, circuit density continues to increase since smaller chips are being made that are packed with ever-increasing number of circuits. Based on the fact that the chip real estate is limited, the only possible way of increasing the capacitance of a storage node capacitor cell is to increase it three-dimensionally, i.e. to grow the cell in the vertical dimension.

In the fabrication of modern DRAM devices, as the fabrication process grows increasingly minute, for instance, from a 0.45 μm fabrication process down to a 0.38 μm fabrication process, the chip real estate available for a storage node capacitor must be proportionally reduced. In order to maintain the same capacitance, or to obtain a higher capacitance, the dimensions of the storage node capacitor cell must be redesigned, i.e., generally to increase the height of the capacitor cell.

Using a 16 mega DRAM device as an example, when the fabrication process used is changed from 0.45 μm to 0.38 μm, the corresponding capacitance of the capacitor cell is reduced from 25 fF to 18 fF. The fabrication process for the cell must therefore be modified and the cell structure be improved in order to increase the capacitance of storage cells fabricated by the 0.38 μm process.

In the conventional 0.45 μm fabrication process, attempts have been made by others to deposit rugged polysilicon at a lower deposition temperature in order to increase the surface area of the capacitor cell. Even though the capacitor cell surface area can be increased by using rugged polysilicon at the ever-miniaturizing fabrication technology, the increased capacitance achieved by using rugged polysilicon can no longer satisfy the demand for higher capacitance.

A conventional 0.45 μm fabrication process of a storage node capacitor cell for a DRAM device is shown in FIGS. 1-5. Referring initially to FIG. 1, wherein a semiconductor substrate 10 is shown which has a layer of a non-doped silicate glass 12 deposited on top. After the insulating layer 12 is photomasked and etched in a conventional etching process, the substrate area 14 is exposed as the storage node capacitor call contact, Next, as shown in FIG. 2, a layer of polysilicon (Poly-2) is deposited as a conformal coating 16. The thickness of Poly-2 is normally in the range between about 400 Å and 700 Å, even though a thickness of 500 Å is frequently used. In order to increase the surface area of the polysilicon layer, a rugged surface polysilicon layer 18 is deposited at a relatively low deposition temperature of between about 500° C. and 600° C. by a chemical vapor deposition technique. The deposition temperature of the rugged polysilicon should be kept relatively low in order to maintain the wave-like surface texture of the rugged polysilicon. It is known that at temperatures above 600° C. the wave-like textured surface of the rugged polysilicon will become smooth and therefore looses its benefit of the large surface areas. The thickness of the rugged polysilicon layer deposited is generally between about 700 Å and about 1000 Å. This is shown in FIG. 3. In a capacitor cell that utilizes rugged polysilicon, it is therefore important not to subject the device in a down-stream process that may be operated at a temperature of higher than 600° C.

In a subsequent process, the Poly-2 layer and the rugged polysilicon layer are patterned by a photomasking process and etched to form the base of the storage node capacitor cell. This is shown in FIG. 4. In the final fabrication step, a second insulating layer, preferably of an oxide-nitride-oxide (ONO) insulating material is deposited by a chemical vapor deposition technique. After the ONO layer 20 is patterned and etched to form a conformal layer on the capacitor cell, a final layer 22 of polysilicon (Poly-3) is deposited by a chemical vapor deposition technique and subsequently formed as the final conformal layer on the storage node capacitor. A conventionally formed storage node capacitor that incorporated the use of a rugged surface polysilicon layer is thus completed.

It is therefore an object of the present invention to provide a stacked capacitor in a DRAM device that has improved capacitance when compared to conventional capacitor cells that incorporate rugged polysilicon layers.

It is another object of the present invention to provide a stacked capacitor in a DRAM device that has improved capacitance without utilizing more chip real estate.

It is a further object of the present invention to provide a stacked capacitor in a DRAM device that has improved capacitance by utilizing the same chip real estate.

It is still another object of the present invention to provide a stacked capacitor for a DRAM device that has improved capacitance by growing three-dimensionally the height of the capacitor cell.

It is yet another object of the present invention to provide a stacked capacitor for a DRAM device that has improved capacitance by enhancing the side-wall thickness of the capacitor cell.

It is still another further object of the present invention to provide a stacked capacitor for a DRAM device that has improved capacitance due to enhanced side-wall thickness achieved by the deposition of an additional layer of polysilicon.

It is yet another further object of the present invention to provide a method of fabricating a stacked capacitor in a DRAM device that has improved capacitance by depositing an additional polysilicon layer prior to the forming of the capacitor cell contact such that the side-wall thickness of the cell can be increased.

SUMMARY OF THE INVENTION

According to the present invention, a stacked capacitor in a DRAM device that has improved capacitance is provided. In the preferred embodiment, an additional polysilicon layer is deposited prior to the formation of the capacitor cell contact such that the thickness of the side-wall is increased to improve the capacitance. The thickness of the additional polysilicon layer can be suitably determined in the range between about 1000 Å and about 6000 Å based on the specific application requirement. The thicker the polysilicon layer deposited, the higher the capacitance of the capacitor cell can be achieved.

The fabrication method of the preferred embodiment can be carried out by first providing a semiconductor substrate, blanket depositing a first insulating layer on the substrate, blanket depositing a first polysilicon layer on the first insulating layer, photomasking and etching a cell contact area for the capacitor in the first insulating and the first polysilicon layer to expose the substrate, depositing a conformal polysilicon layer on top of the first polysilicon layer and the cell contact area, depositing a conformal third polysilicon layer of rugged polysilicon layer over the second polysilicon layer, photomasking and etching the first, the second polysilicon layer and the third rugged polysilicon layer in areas other than that defining the capacitor cell, depositing a conformal second insulating layer over the third polysilicon layer, depositing a conformal fourth polysilicon layer over the second insulating layer, and then photomasking and etching the second insulating layer and the fourth polysilicon layer to define the stacked capacitor.

The preferred embodiment of the present invention further provides a stacked capacitor formed in a semiconductor device that includes a semiconductor substrate, a first insulating layer on a substrate, a first polysilicon layer on the first insulating layer, a capacitor cell formed in the first insulating layer and the first polysilicon layer, a second polysilicon layer covering the capacitor cell, a second insulating layer on the second polysilicon layer, and a third polysilicon layer on top of the second insulating layer.

BRIEF DESCRIPTION OF THE DRAWINGS

Other objects, features and advantages of the present invention will become apparent upon consideration of the specification and the appended drawings, in which:

FIG. 1 is an enlarged cross-sectional view showing a conventional method for making a storage node capacitor wherein a layer of a non-doped silicate glass is deposited on a semiconductor substrate.

FIG. 2 is an enlarged cross-sectional view showing a conventional capacitor cell having a Poly-2 layer deposited in the cell.

FIG. 3 is an enlarged cross-sectional view showing a conventional capacitor cell having a layer of rugged surface polysilicon deposited in the cell.

FIG. 4 is an enlarged cross-sectional view showing a conventional capacitor cell after patterning and etching of the polysilicon layers.

FIG. 5 is an enlarged cross-sectional view showing a conventional capacitor cell having final layers of oxide-nitride-oxide and polysilicon deposited and formed on top.

DETAILED DESCRIPTION OF THE PREFERRED EMBODIMENTS

According to the present invention, a method of forming a stacked capacitor that has improved capacitance by utilizing an additional layer of polysilicon to enhance the side-wall thickness and a stacked capacitor formed in a semiconductor device by such method are provided.

Figure 6:
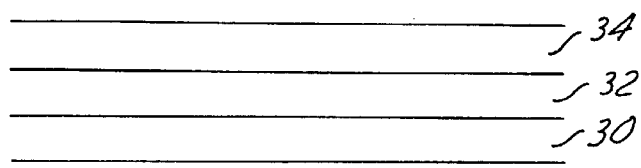
FIG. 6 is an enlarged cross-sectional view of a present invention capacitor cell having a pad polysilicon layer deposited on top of the first insulating layer.

In the preferred embodiment, referring initially to FIG. 6, a substrate 30 of a semiconducting material is first provided. A non-doped silicate glass (NSG) layer 32 is then blanket deposited on top of the substrate layer 30 by a chemical vapor deposition technique. Subsequentially, a pad polysilicon layer 34 having a thickness in the range between about 1000 Å and about 9000 Å is deposited on top of the insulating layer 32. The thickness of the pad polysilicon layer can be suitably determined based on the specific application and the capacitance desired.

Figure 7:
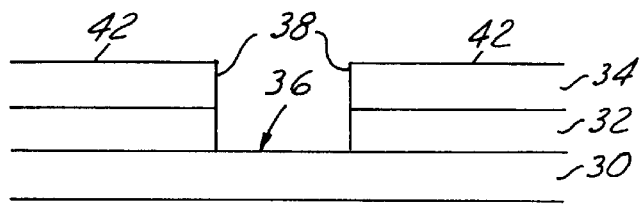
FIG. 7 is an enlarged cross-sectional view of the present invention capacitor cell having the pad polysilicon layer and the first insulating layer patterned to expose the cell plate area.

In the next processing step, shown in FIG. 7, the NSG layer 32 and the pad polysilicon layer 34 are patterned (not shown), photomasked and etched by a conventional method to form a storage node capacitor cell contact 36. At the capacitor cell contact 36, the semiconducting material of the substrate, e.g., silicon, is exposed.

It should be noted that the pad polysilicon layer 34 significantly increases the side-wall thickness of the capacitor cell to be built in subsequent processing steps.

Figure 8:
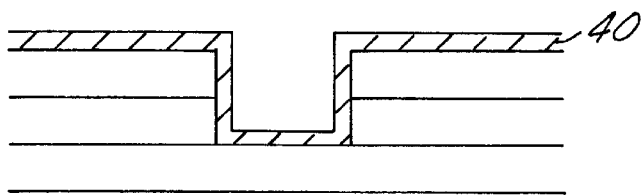
FIG. 8 is an enlarged cross-sectional view of the present invention capacitor cell having a conformal Poly-2 layer deposited in the cell.

A second polysilicon layer (Poly-2) 40 is then conformally deposited by a chemical vapor deposition technique to cover the cell contact area 36, the side wall areas 38, and the top surface 42 of the device. The thickness of the Poly-2 layer deposited can be suitably determined in the range between about 300 Å and about 900 Å, even though in general a thickness of 500 Å is used. This is shown in FIG. 8.

Figure 9:
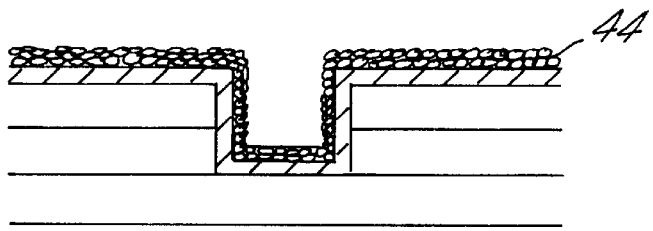
FIG. 9 is an enlarged cross-sectional view of the present invention capacitor cell having a conformal rugged surface polysilicon layer deposited in the cell.

In the next fabrication process, as shown in FIG. 9, a layer of a rugged surface polysilicon 44 is conformally deposited by a chemical vapor deposition process on top of the Poly-2 layer. In order to form a wave-like surface texture of the rugged polysilicon, a lower deposition temperature between about 500° C. and about 600° C. should be used. It has been found that at any temperatures above 600° C., the rugged polysilicon surface will become smooth and therefore lose its large surface area benefit.

Figure 10:
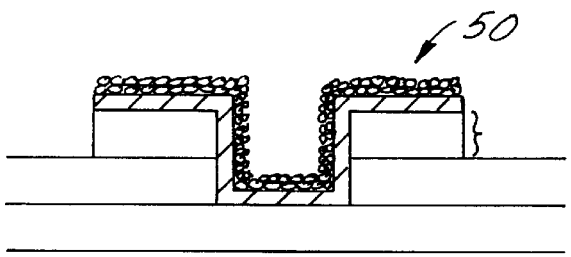
FIG. 10 is an enlarged cross-sectional view of the present invention capacitor cell having the polysilicon layers patterned and etched to form the coil contact area.

The Poly-2 layer 40 and the rugged polysilicon layer 44 are then patterned, photomasked and etched (not shown) by a conventional process to form the capacitor cell 50 shown in FIG. 10. It should be noted that the notation X in FIG. 10 indicates the additional side-wall thickness built by the additional pad polysilicon layer 34 of the present invention. As previously elucidated, the thickness can be anywhere between about 1000 Å and about 9000 Å depending on the requirement of the specific application. The upper limit of the thickness may be controlled by the phenomenon that as the capacitor cell gets deeper, it becomes more difficult to deposit the subsequent layers uniformly by a chemical vapor deposition process. It is undesirable if the capacitor cell is completely filled up by the material deposited. This is shown in FIG. 10.

Figure 11:
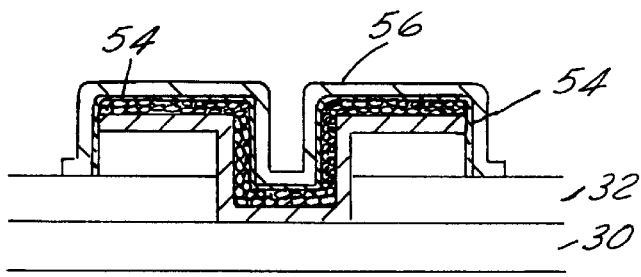
FIG. 11 is an enlarged cross-sectional view of the present invention capacitor cell after the final dielectric layer and the final polysilicon layer are deposited and formed.

In the final fabrication steps, as shown in FIG. 11, a second insulating layer 54 which is preferably oxide-nitride-oxide (ONO) is deposited as a conformal coating on top of the capacitor cell 50. Other suitable insulating materials such as silicon nitride, silicon oxynitride and silicon oxide may also be used if desired. On top of the ONO layer 54, is then deposited a final polysilicon layer (Poly-3) to a thickness of between about 900 Å and about 1500 Å. A preferred thickness for the Poly-3 layer is approximately 1200 Å. The thickness of the ONO dielectric layer 54 deposited is generally thinner than that of the Poly-3 layer, for instance, in the range between about 200 Å and about 400 Å thickness. The final polysilicon layer (Poly-3) is then patterned, photomasked and etched to complete the formation of the capacitor cell 50.

It has been demonstrated that the present invention novel process of increasing the capacitance of a capacitor cell on a DRAM device can be accomplished by utilizing an additional pad polysilicon layer. When a pad polysilicon layer having a thickness of 2000 Å is added in a 0.38 µm fabrication process, a capacitance of 25 fF/cell is obtained. As stated previously, the thickness of the pad polysilicon layer can be suitably chosen to satisfy a specific application. For instance, when a thicker pad polysilicon layer of 5000 Å is used, a capacitance of 37 fF/cell is obtained. These advantageous capacitance values which are made possible by the present invention novel process are compared favorably with the capacitance value of 18 fF/cell for a capacitor made by the conventional process, i.e. without the use of an additional layer of polysilicon. The benefits achieved by the present invention novel process and the subsequently produced stacked capacitor cells are therefore demonstrated.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the inventions.

The embodiment of the invention in which an exclusive property or privilege is claimed are defined as follows:

1. A method of forming a capacitor comprising the steps of:
   providing a substrate,
   depositing a first insulating layer on said substrate,
   depositing a first polysilicon layer as a pad layer for increasing a capacitance of said capacitor on said first insulating layer, said pad layer having a thickness of at least 1000 Å,
   forming a cell contact for said capacitor in said first insulating layer and said first polysilicon pad layer exposing the substrate,
   depositing a second polysilicon layer on said first polysilicon layer and said cell contact,
   depositing a third polysilicon layer of rugged polysilicon over said second polysilicon layer,
   depositing a second insulating layer on said third polysilicon layer, and
   depositing a fourth polysilicon layer on said second insulating layer.

2. A method according to claim 1 further comprising the step of depositing an additional polysilicon layer on top of said second polysilicon layer.

3. A method according to claim 2, wherein said additional polysilicon layer is preferably formed in a wave-like surface texture.

4. A method according to claim 2, wherein said additional polysilicon layer is preferably formed as rugged polysilicon at a deposition temperature of less than 600° C.

5. A method according to claim 1, wherein said first polysilicon layer is a pad polysilicon layer deposited to substantially increase the thickness of the capacitor sidewall.

6. A method according to claim 1, wherein said first polysilicon layer is deposited to a thickness of at least 1000 Å.

7. A method according to claim 1, wherein said first insulating layer deposited is preferably of a non-doped silicate glass (NSG).

8. A method according to claim 1, wherein said second insulating layer deposited is preferably of an oxide-nitride-oxide material.

9. A method according to claim 1, wherein said second insulating layer deposited is selected from the group consisting of oxide-nitride-oxide, silicon nitride, silicon oxynitride and silicon oxide.

10. A method according to claim 1, wherein said stacked capacitor is formed in a dynamic random access memory device.

11. A method of forming a stacked capacitor having improved capacitance comprising the steps of:
    providing a semiconductor substrate,
    blanket depositing a first insulating layer over said substrate,
    blanket depositing a first polysilicon layer over said first insulating layer,
    photomasking and etching a cell contact area for said capacitor in said first insulating and said first polysilicon layer exposing the substrate,
    depositing a conformal second polysilicon layer over said first polysilicon layer and said cell contact area,
    depositing a conformal third polysilicon layer of rugged polysilicon over said second polysilicon layer,
    photomasking and etching said first and second polysilicon layers to define said capacitor cell,
    depositing a conformal second insulating layer over said third polysilicon layer,
    depositing a conformal fourth polysilicon layer over said second insulating layer, and
    photomasking and etching said second insulating layer and said fourth polysilicon layer to define said stacked capacitor.

12. A method according to claim 11, wherein said first insulating layer deposited is preferably a non-doped silicate glass.

13. A method according to claim 11, wherein said second insulating layer deposited is preferably oxide-nitride-oxide.

14. A method according to claim 11, wherein said first polysilicon layer is deposited to a thickness of not less than 1000 Å such that a side-wall thickness of the capacitor is increased to improve its capacitance.

* * * * *